US009812223B2

(12) United States Patent
Kim

(10) Patent No.: US 9,812,223 B2
(45) Date of Patent: Nov. 7, 2017

(54) SEMICONDUCTOR MEMORY DEVICE AND METHOD OF OPERATING THE SAME

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/211,779

(22) Filed: Jul. 15, 2016

(65) Prior Publication Data
US 2016/0329105 A1 Nov. 10, 2016

Related U.S. Application Data

(63) Continuation-in-part of application No. 14/292,299, filed on May 30, 2014, now Pat. No. 9,406,402.

(30) Foreign Application Priority Data

Jun. 21, 2013 (KR) ........................ 10-2013-0071659

(51) Int. Cl.
G11C 29/50 (2006.01)
G11C 11/56 (2006.01)
G11C 16/34 (2006.01)
G11C 16/24 (2006.01)
G11C 16/26 (2006.01)

(52) U.S. Cl.
CPC .... G11C 29/50004 (2013.01); G11C 11/5642 (2013.01); G11C 16/24 (2013.01); G11C 16/26 (2013.01); G11C 16/3418 (2013.01); G11C 2029/5004 (2013.01)

(58) Field of Classification Search
CPC .......... G11C 29/50004; G11C 16/3418; G11C 16/26; G11C 11/5642; G11C 2029/5004
See application file for complete search history.

(56) References Cited

U.S. PATENT DOCUMENTS

| | | | | |
|---|---|---|---|---|
| 5,961,653 A * | 10/1999 | Kalter | ................. | G06F 11/2635 714/30 |
| 6,288,936 B1 * | 9/2001 | Kawamura | ......... | G11C 11/5621 365/185.03 |
| 6,381,670 B1 * | 4/2002 | Lee | .......................... | G11C 8/10 365/104 |
| 6,453,433 B1 * | 9/2002 | Vollrath | ................. | G11C 29/02 714/718 |
| 6,545,912 B1 * | 4/2003 | Pawletko | ......... | G11C 29/50004 365/185.18 |
| 2005/0018490 A1 * | 1/2005 | Leconte | ............. | G11C 16/3418 365/185.29 |
| 2005/0083735 A1 * | 4/2005 | Chen | ................... | G11C 11/5628 365/185.17 |
| 2006/0209592 A1 * | 9/2006 | Li | ....................... | G11C 11/5642 365/185.03 |
| 2008/0094891 A1 * | 4/2008 | Ho | ...................... | G11C 11/5642 365/185.03 |

(Continued)

Primary Examiner — Joseph D Torres
(74) Attorney, Agent, or Firm — IP & T Group LLP

(57) ABSTRACT

A semiconductor memory device includes memory cells coupled to a word line; and a peripheral circuit configured to read first to kth page data from the memory cells by sequentially applying first to kth test voltages to the word line, where k is a natural number greater than 3, wherein the peripheral circuit is configured to gradually reduce times during which the first to kth test voltages are applied to the word line.

11 Claims, 12 Drawing Sheets

(56) References Cited

U.S. PATENT DOCUMENTS

| | | | |
|---|---|---|---|
| 2008/0144370 A1* | 6/2008 | Park | G11C 11/5628 365/185.03 |
| 2010/0220511 A1* | 9/2010 | Kurjanowicz | G11C 17/16 365/96 |
| 2012/0250414 A1* | 10/2012 | Khandelwal | G11C 16/26 365/185.17 |
| 2013/0015915 A1* | 1/2013 | Komatsu | G11C 29/48 327/564 |
| 2013/0223155 A1* | 8/2013 | Oowada | G11C 11/5642 365/185.22 |
| 2014/0071761 A1* | 3/2014 | Sharon | G11C 16/26 365/185.18 |
| 2015/0029796 A1* | 1/2015 | Choi | G11C 11/5642 365/189.05 |
| 2016/0260492 A1* | 9/2016 | You | G11C 16/26 |
| 2016/0329109 A1* | 11/2016 | Kim | G11C 29/50004 |

* cited by examiner

SEMICONDUCTOR MEMORY DEVICE AND METHOD OF OPERATING THE SAME

CROSS-REFERENCE TO RELATED APPLICATION

The present application is a Continuation in Part of U.S. patent application Ser. No. 14/292,299 filed on May 30, 2014 which claims priority to Korean patent application No. 10-2013-0071659 filed on Jun. 21, 2013 the entire disclosure of which is incorporated by reference herein.

BACKGROUND

1. Field of the Invention

Various embodiments of the present invention relate to an electronic device, and more particularly, to a semiconductor memory device and a method of operating the same.

2. Description of the Related Art

Semiconductor memory devices are memory devices implemented using semiconductor materials such as silicon (Si), germanium (Ge), gallium arsenide (GaAs), indium phosphide (InP), and so on. The semiconductor memory devices are classified into volatile memory devices and nonvolatile memory devices.

The volatile memory devices are memory devices in which stored data is lost when their power supplies are interrupted. The volatile memory devices include a static random access memory (SRAM), a dynamic RAM (DRAM), a synchronous DRAM (SDRAM), etc. The nonvolatile memory devices are memory devices that retain stored data even when their power supplies' are interrupted. The nonvolatile memory devices include a read only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memories are classified into a NOR type and a NAND type.

SUMMARY

Various embodiments of the present invention are directed to a semiconductor memory device and a method of operating the same in which a read operation speed and a regulating speed of a read voltage may be improved.

An embodiment of the present invention provides a semiconductor memory device, including memory cells coupled to a word line; and a peripheral circuit configured to read first to kth page data from the memory cells by sequentially applying first to kth test voltages to the word line, where k is a natural number greater than 3, wherein the peripheral circuit is configured to gradually reduce times during which the first to kth test voltages are applied to the word line.

An embodiment of the present invention provides a method of operating a semiconductor memory device, the method including reading first to kth page data from memory cells coupled to a word line by sequentially applying first to kth test voltages to the word line, wherein a read voltage applied to the word line during the read operation is determined by comparing a number of data bits changed between (k−2)th page data and (k−1)th page data with a number of data bits changed between the (k−1)th page data and the kth page data, and times during which the first to kth test voltages are applied are gradually reduced.

An embodiment of the present invention provides a method of operating a semiconductor memory device, the method including reading first to kth page data from memory cells coupled to a word One by sequentially applying first to kth test voltages to the word One wherein a read voltage applied to the word One during the read operation is determined by comparing a number of data bits changed between (k−2)th page data and (k−1)th page data with a number of data bits changed between the (k−1)th page data and the kth page data, and times during which data sensed by the first to kth test voltages are evaluated are gradually reduced.

An embodiment of the present invention provides a method of operating a semiconductor memory device, the method including precharging bit lines; and reading first to kth page data from memory cells coupled to a selected word line by applying a pass voltage to unselected word lines and sequentially applying first to kth test voltages to the selected word line, wherein the pass voltage decreases gradually, wherein a read voltage applied to the selected word lines is determined by comparing a number of data bits changed between (k−2)th page data and (k−1)th page data with a number of data bits changed between the (k−1)th page data and the kth page data

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Various embodiments will now be described more fully with reference to the accompanying drawings in which some embodiments are shown. These inventive concepts may, however, be embodied in different forms and should not be construed as limited to the embodiments set, forth herein. Rather, these embodiments are provided so that this disclosure is thorough and complete and fully conveys the inventive concept to those skilled in the art.

Throughout this specification, when an element is referred to as being "connected" to another element, the element can be "directly connected" to the other element or "indirectly connected" to the other element with other intervening element(s). Throughout this specification, when a certain part "includes" a certain component, it does not exclude cases in which other components are included unless otherwise defined.

Figure 1:
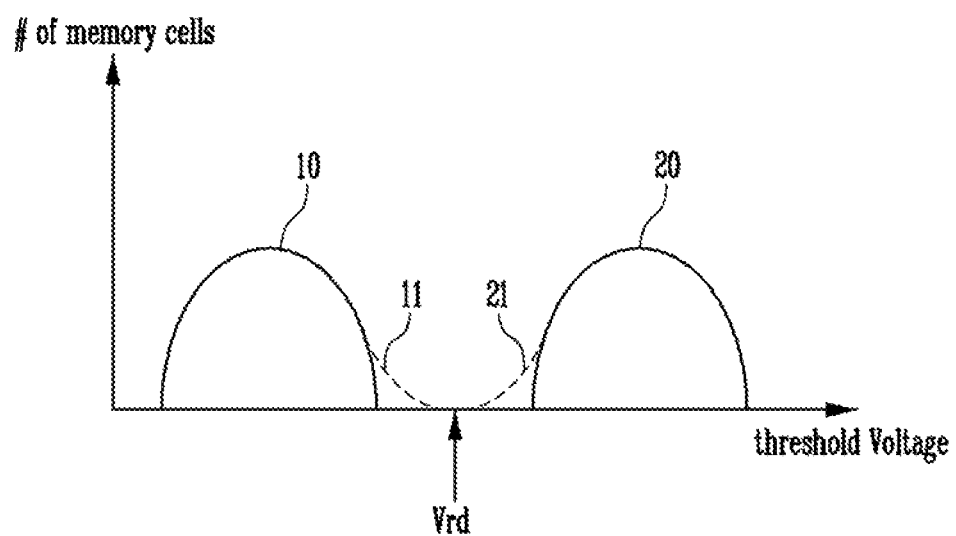
FIG. 1 is a graph showing a voltage distribution of memory cells included in a semiconductor memory device.

FIG. 1 is a graph showing a voltage distribution of memory cells included in a semiconductor memory device. In FIG. 1, a horizontal-axis represents a threshold voltage, and a vertical-axis represents the number of memory cells.

Referring to FIG. 1, memory cells may have a plurality of threshold voltage states 10 and 20. For example, when one bit is stored in each memory cell the memory cells may have a first threshold voltage state 10 or a second threshold voltage state 20 as shown in FIG. 1. Specifically, the memory cells having a first threshold voltage state 10 may be defined to store a logical state "low," and the memory cells having a second threshold voltage state 20 may be defined to store a logical state "high."

As is well known, distribution widths of the threshold voltage states 10 and 20 may be widened due to various causes. As the distribution widths of the threshold voltage states 10 and 20 are widened, the reliability of data of the memory cells is reduced. For example, the memory cells having the first threshold voltage state 10 may have a third threshold voltage state 11 by increasing threshold voltages thereof. The memory cells having the second threshold voltage state 20 may have a fourth threshold voltage state 21 by reducing threshold voltages thereof.

As a read margin is reduced, it is necessary to accurately set a read voltage Vrd for an effective read operation.

Conventionally, the read voltage Vrd has been regulated by a controller (1000, see FIG. 9) located outside the semiconductor memory device. More specifically, the controller controls the semiconductor memory device to perform a read operation, and determines whether more error bits than a predetermined number are included in corresponding data when read data is output. If more error bits than the predetermined number are included in the corresponding data, the controller regulates the read voltage Vrd according to a specific algorithm. That is, according to the prior art, a time that the read data is output from the semiconductor memory device is required to determine whether to regulate the read voltage Vrd.

Figure 2:
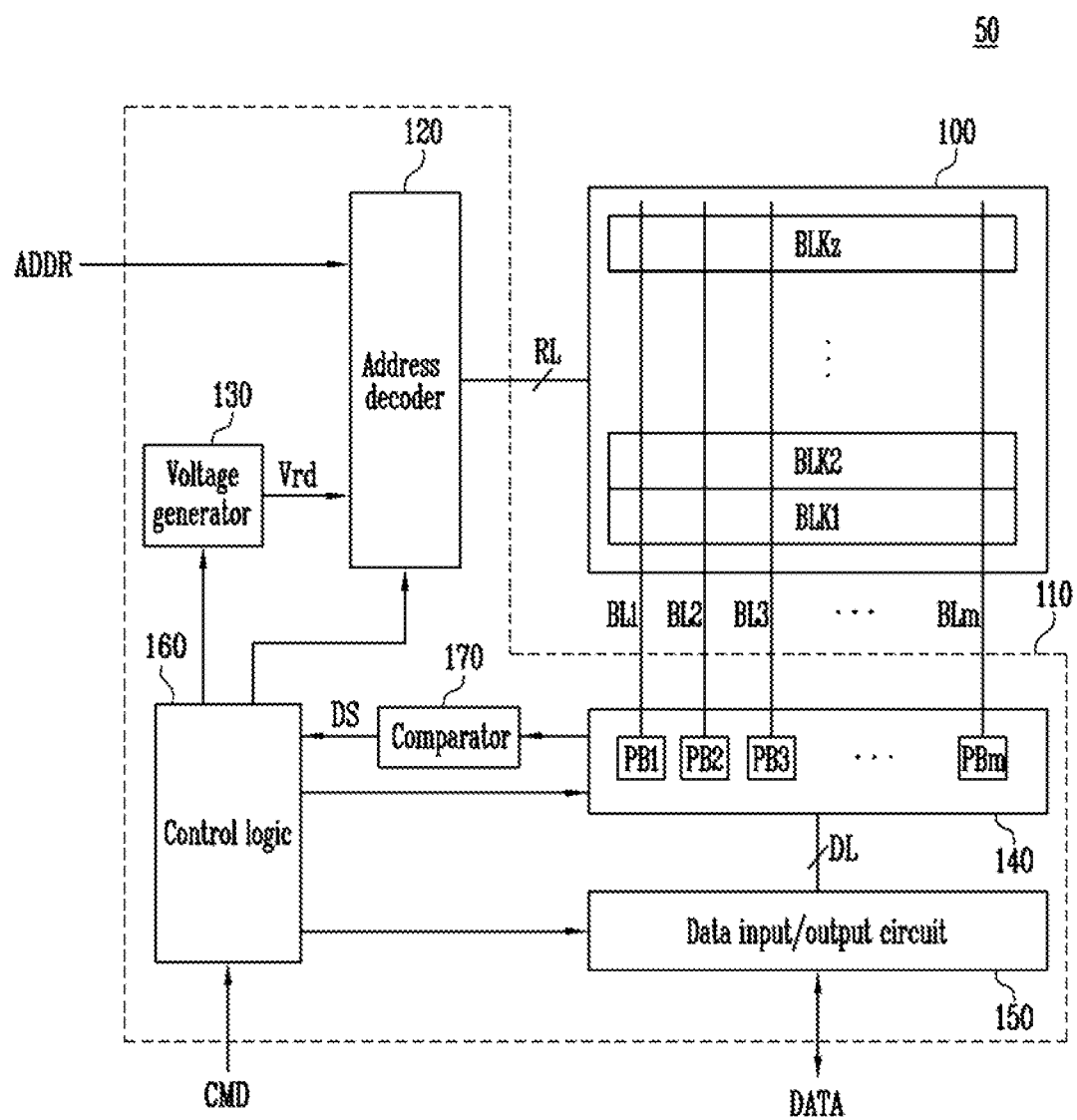
FIG. 2 is a block diagram showing a semiconductor memory device according to an embodiment of the present invention.

FIG. 2 is a block diagram showing a semiconductor memory' device 50 according to an embodiment of the present invention.

Referring to FIG. 2, the semiconductor memory device 50 includes a memory cell array 100 and a peripheral circuit 110.

The memory cell array 100 includes a plurality of memory blocks BLK1 to BLKz. The plurality of memory blocks BLK1 to BLKz are connected to an address decoder 120 through row lines RL, and to a read/write circuit 140 through bit lines BL1 to BLm. Each of the plurality of memory blocks BLK1 to BLKz includes a plurality of memory cells. As an embodiment, the plurality of memory cells are nonvolatile memory cells.

The peripheral circuit 110 includes the address decoder 120, a voltage generator 130, the read/write circuit 140, a data input/output circuit 150, a control logic 160, and a comparator 170.

The address decoder 120 is connected to the memory cell array 100 through the row lines RL. The address decoder 120 is configured to operate in response to control of the control logic 160.

The address decoder 120 receives an address ADDR through a global buffer (not shown) located inside the semiconductor memory device 50. The address ADDR includes a block address and a row address when a read operation is performed.

The address decoder 120 is configured to decode the block address of the received address ADDR. The address decoder 120 selects one memory block of the memory blocks BLK1 to BLKz according to the decoded block address.

The address decoder 120 is configured to decode the row address of the received address ADDR. The address decoder 120 applies voltages provided from the voltage generator 130 to the row lines RL, and selects one word line of the selected memory block according to the decoded row address. A read voltage is applied to the selected word line. A pass voltage, which is higher than the read voltage, is applied to unselected word lines.

The address decoder 120 may include an address buffer, a block decoder, a row decoder, and so on.

The voltage generator 130 is configured to generate a plurality of voltages using an external power voltage provided to the semiconductor memory device 50. The voltage generator 130 operates in response to control of the control logic 160.

As an embodiment, the voltage generator 130 may regulate the external power voltage, and generate an internal power voltage. The internal power voltage generated in the voltage generator 130 is used as an operation voltage of the semiconductor memory device 50.

As an embodiment, the voltage generator 130 may generate a plurality of voltages using the external power voltage or the internal power voltage. For example, the voltage generator 130 includes a plurality of pumping capacitors configured to receive the internal power voltage, selectively activates the plurality of pumping capacitors, and generates the plurality of voltages in response to control of the control logic 160. The generated voltages may be applied to the word lines by the address decoder 120.

The read/write circuit 140 includes first to $m^{th}$ page buffers PB1 to PBm. The first to $m^{th}$ page buffers PB1 to PBm are connected to the memory cell array 100 through first to $m^{th}$ bit lines BL1 to BLm, respectively. The first to $m^{th}$ page buffers PB to PBm operate in response to control of the control logic 160.

The first to $m^{th}$ page buffers PB1 to PBm exchange data DATA with the data input/output circuit 150. When a read operation is performed, the first to $m^{th}$ page buffers PB1 to PBm read the data DATA from the memory cells connected to the selected word line through the first to $m^{th}$ bit lines BL1 to BLm, and output the read data DATA to the data input/output circuit 150 through data lines DL.

As an embodiment, the read/write circuit 140 may include a column select circuit.

The data input/output circuit 150 is connected to the first to $m^{th}$ page buffers PB1 to PBm through the data lines DL. The data input/output circuit 150 operates in response to control of the control logic 160. When a read operation is performed, the data input/output circuit 150 receives the data DATA from the first to $m^{th}$ page buffers PB1 to PBm, and transmits the received data DATA to the global buffer (not shown) of the semiconductor memory device 50.

The control logic 160 is connected to the address decoder 120, the voltage generator 130, the read/write circuit 140, the data input/output circuit 150, and the comparator 170. The control logic 160 receives a command CMD through the global buffer (not shown) of the semiconductor memory device 50. The control logic 160 is configured to control overall operations of the semiconductor memory device 50 in response to the command CMD.

According to an embodiment of the present invention, the control logic 160 is configured to regulate the read voltage generated in the voltage generator 130 in response to a detection signal DS received from the comparator 170.

The voltage generator 130 generates sequentially increasing test voltages. Whenever one of the test voltages is applied to the selected word line, the page buffers PB1 to PBm read page data from selected memory cells. Each time page data is read, the control logic 160 compares bits of the corresponding page data and bits of the previous page data, and detects bits changed from a first logical state (for example, "high") to a second logical state (for example, "low"). As a detection result, when the number of bits changed from the first logical state to the second logical state is smallest, the corresponding test voltage is determined as the read voltage.

More particularly, first to $k^{th}$ (k is a natural number greater than 2) page data are read from the selected memory cells using first to $k^{th}$ test voltages. The control logic 160 detects data bits changed between $(k-2)^{th}$ and $(k-1)^{th}$ page data, and stores a result of detection in latches of the page buffers PB1 to PBm. Further, the control logic 160 detects data bits changed between $(k-1)^{th}$ and $k^{th}$ page data, and stores a detection result in other latches of the page buffers PB1 to PBm.

The comparator 170 compares the number of changed data bits between $(k-2)^{th}$ and $(k-1)^{th}$ page data, and the number of changed data bits between $(k-1)^{th}$ and $k^{th}$ page data in response to control of the control logic 160. According to a result of comparison the comparator 170 generates the detection signal DS. The control logic 160 determines, the read voltage in response to the detection signal DS.

According to an embodiment of the present invention, the semiconductor memory device 50 may regulate the read voltage itself. Therefore, a time required for regulating the read voltage can be shortened.

Figure 3:
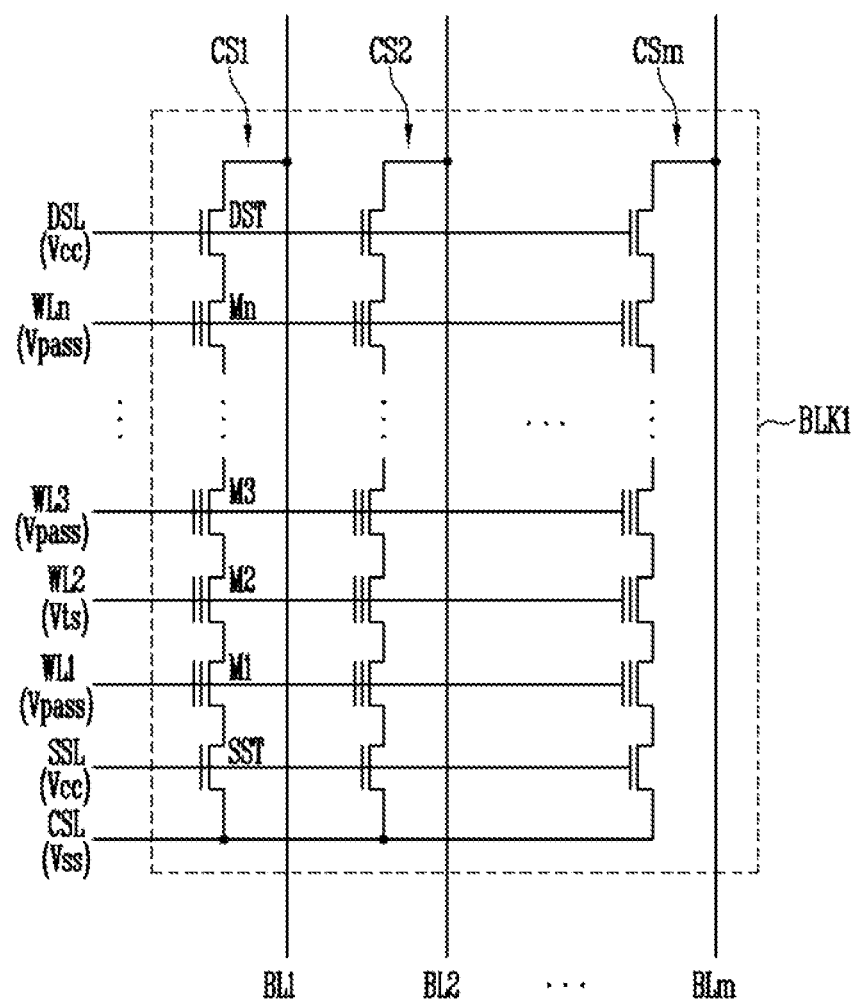
FIG. 3 is a circuit diagram showing one of a plurality of memory blocks of FIG. 2 specifically.

FIG. 3 is a circuit diagram showing one example BLK1 of a plurality of memory blocks BLK1 to BLKz of FIG. 2;

Referring to FIGS. 2 and 3, the memory block BLK1 includes first to $m^{th}$ cell strings CS1 to CSm. The first to $m^{th}$ cell strings CS1 to CSm are connected to first to mm bit lines BL1 to BLm, respectively.

The plurality of cell strings CS1 to CSm include source select transistors SST, a plurality of memory cells M1 to Mm and drain select transistors DST. The source select transistors SST are connected to a source select line SSL. The first to $m^{th}$ memory cells M1 to Mm are connected to first to $m^{th}$ word lines WL1 to WLm. The drain select transistors DST are connected to a drain select line DSL. Source sides of the source select transistors SST are connected to a common source line CSL. Drain sides of the drain select transistors DST are connected to the bit lines BL1 to BLm. The source select line SSL, the first to mm word lines WL1 to WLm, and the drain select line DSL are included in the row lines RL described with reference to FIG. 2, and driven by the address decoder 120. The common source line CSL is controlled by, for example, a common source line controller (not shown).

As an embodiment, although not shown in FIG. 3, the memory block BLK1 may be further connected to at least one dummy word line, and may further include the memory cells connected to at least one dummy word line. As an embodiment, differently from FIG. 3, the memory block BLK1 may be connected two or more drain select lines, and may include the drain select transistors connected to the drain select lines. Further, the memory block BLK1 may be connected to two or more source select lines, and may include the source select transistors connected to the source select lines.

When a read voltage is regulated, the first to $m^{th}$ bit lines BL1 to BLm are precharged. The common source line CSL is kept to a ground voltage. A power voltage is applied the source select line SSL and the drain select line DSL, and the source select transistors SST and the drain select transistors DST are turned on. A pass voltage Vpass of a high voltage is applied to the unselected word lines WL1 and WL3 to WLn and the corresponding memory cells are turned on regardless of their threshold voltages. A test voltage Vts is applied to the selected word line WL2, and selected memory cells M2 are turned on or off according to their threshold voltages. The first to $m^{th}$ page buffers PB1 to PBm detect voltage changes of the first to $m^{th}$ bit lines BL1 to BLm, and read one piece of page data of the selected memory cells. The page data includes bits corresponding to the number (m) of the selected memory cells.

When the test voltage Vts is changed, a plurality of pieces of page data of the selected memory cells may be read. This will be described with reference to FIG. 4 in more detail.

Figure 4:
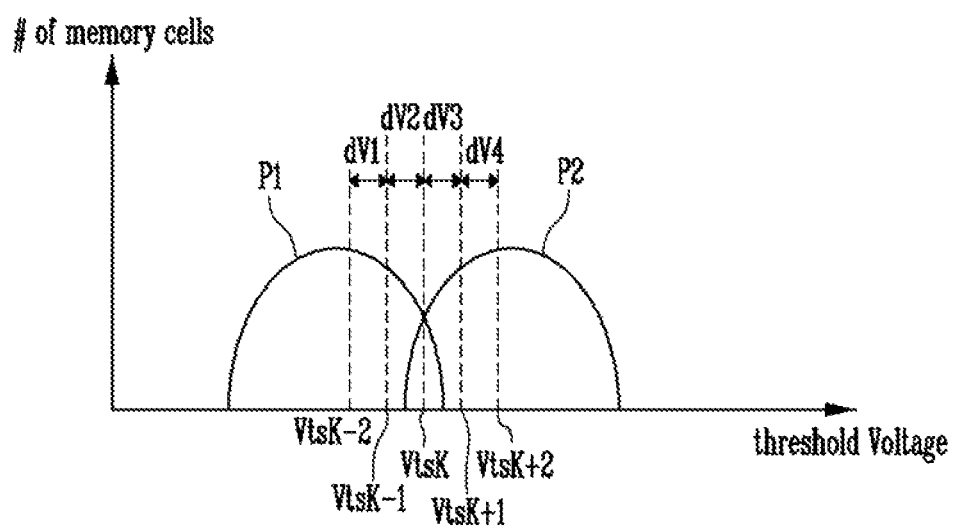
FIG. 4 is a graph showing a threshold voltage distribution of selected memory cells.

FIG. 4 is a graph showing a threshold voltage distribution of selected memory cells. In FIG. 4, a horizontal-axis represents a threshold voltage, and a vertical-axis represents the number of memory cells.

Referring to FIG. 4, the selected memory cells have a first threshold voltage state P1, and a second threshold voltage state P2. In FIG. 4, the first threshold voltage state P1 and the second threshold voltage state P2 overlap in part of a voltage range.

As a plurality of test voltages VtsK−2 to VtsK+2 are sequentially applied to selected word lines, a plurality of pieces of page data may be read from the selected memory cells (K is a natural number). When the $(K-2)^{th}$ test voltage VtsK−2 is applied to the selected word line, page buffers PB1 to PBm read $(K-2)^{th}$ page data. When a threshold voltage of a memory cell is higher than the $(K-2)^{th}$ test voltage VtsK−2, data of the corresponding memory cell read in a first logical state (hereinafter, a logic value low). When the threshold voltage of the memory cell is lower than the $(K-2)^{th}$ test voltage VtsK−2, data of the corresponding memory cell is read in a second logical state (a logic value "high"). That is, the (K−2) page data is determined according to whether the threshold voltages of the selected memory cells are lower or higher than the $(K-2)^{th}$ test voltage VtsK−2.

In the same way, $(K-1)^{th}$ to $(K+2)^{th}$ page data may be read from the selected memory cells using the $(K-1)^{th}$ to $(K+2)^{th}$ test voltages VtsK−1 to VtsK+2, respectively. That is, the $(K-2)^{th}$ to $(K+2)^{th}$ (K is a natural number) page data may be sequentially acquired using the $(K-2)^{th}$ to $(K+2)^{th}$ test voltages VtsK−2 to VtsK+2.

As an exemplary embodiment, whenever the test voltage Vts is changed, the bit lines BL1 to BLm (see FIG. 3) are precharged, and a plurality of pieces of page data may be read.

As another exemplary embodiment, the bit lines BL1 to BLm are precharged only when a read operation is performed on the first page data, subsequently, the test voltage Vts is only changed without precharging, and the plurality of pieces of page data may be read. In this case, a regulating speed of the read voltage can be improved. As described above, when the bit lines BL1 to Blm are precharged once and data are read by changing the test voltage Vts, the test voltage Vts may be applied to the selected word line and at the same time, the pass voltage may be applied to the remaining unselected word lines. The pass voltage may be gradually reduced against the decrease of potentials of the bit lines BL1 to BLm caused by leakage current. In other words, when leakage of current occurs in the bit lines BL1 to BLm, the potentials of the bit lines BL1 to BLm may be reduced. Thus, data may be read by gradually reducing the pass voltage. For example, the pass voltage may be gradually reduced each time the test voltage Vts is sequentially applied to the selected word line.

Figure 5:
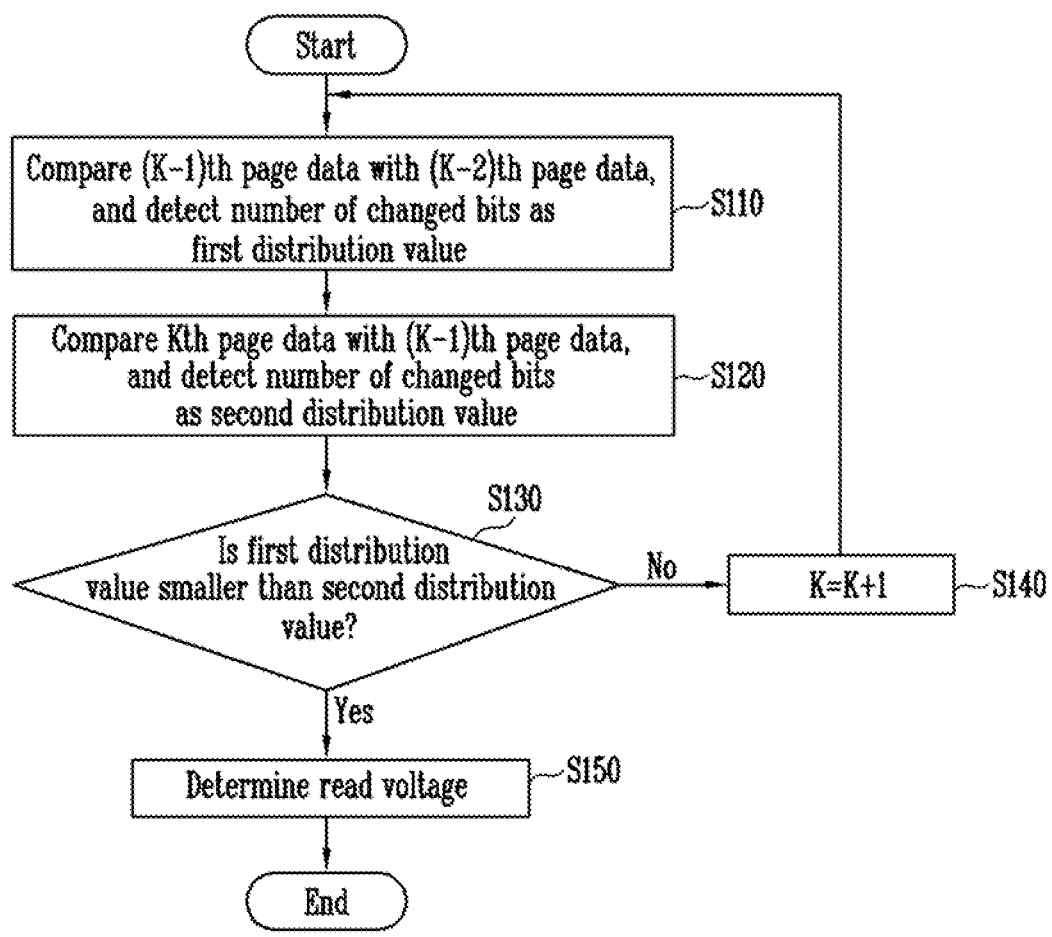
FIG. 5 is a flowchart showing a method of operating a semiconductor memory device according to an embodiment of the present invention.

FIG. 5 is a flowchart showing a method of operating a semiconductor memory device 50 according to an embodiment of the present invention.

Describing to FIG. 5 with reference to FIG. 4, in operation S110, $(K-1)^{th}$ page data is compared with $(K-2)^{th}$ page data and the number of bits changed from a logical value "low" to a logical value "high" is detected as a first distribution value.

Operation S110 may include an operation of reading the $(K-1)^{th}$ page data and the $(K-2)^{th}$ page data, and an operation of comparing the $(K-1)^{th}$ page data and the $(K-2)^{th}$ page data. The $(K-2)^{th}$ page data is read using a $(K-2)^{th}$ test voltage VtsK-2. The $(K-1)^{th}$ page data is read using a $(K-1)^{th}$ test voltage VtsK-1. Here, memory cells corresponding to a first voltage range dV1 are determined as a logical value "low" when a read operation is performed using the $(K-2)^{th}$ test voltage VtsK-2, and as a logical value "high" when a read operation is performed using the $(K-1)^{th}$ test voltage VtsK-1. Therefore, the number of memory cells corresponding to the first voltage range dV1 is the number of bits changed from a logical value "low" to a logical value "high." That is, the first distribution value means the number of memory cells corresponding to the first voltage range dV1.

In operation S120, $K^{th}$ page data is compared with the $(K-1)^{th}$ page data, and the number of bits changed from a logical value "low" to a logical value "high" is detected as a second distribution value.

Operation S120 may include an operation of reading the $K^{th}$ page data, and an operation of comparing the $K^{th}$ page data and the $(K-1)^{th}$ page data.

The $K^{th}$ page data is read using a $K^{th}$ test voltage VtsK. Memory cells corresponding to a second voltage range dV2 are determined as a logical value "low" when a read operation is performed using the $(K-1)^{th}$ test voltage VtsK-1, and as a logical value "high" when a read operation is performed using the $K^{th}$ test voltage VtsK. Therefore, the second distribution value means the number of memory cells corresponding to the second voltage range dV2.

In operation S130, it is determined whether the first distribution value is smaller than the second distribution value. If the first distribution value is not smaller than the second distribution value, operation S140 is performed. Otherwise, operation S150 is performed.

In FIG. 4, the number of memory cells corresponding to the first voltage range dV1 is greater than the number of memory cells corresponding to the second voltage range dV2. That is, because the first distribution value is greater than the second distribution value operation S140 is performed.

In operation S140, a K value increases by 1.

In operation S150, if the first distribution value is smaller than the second distribution value, a read voltage is determined. Here, the read voltage may be determined as a previous test voltage VtsK-1 of the recently used test voltage VtsK.

Meanwhile, because operations S110 and S120 are performed again after operation S140, the first distribution value is defined as the number of memory cells corresponding to the second voltage range dV2, and the second distribution value is defined as the number of memory cells corresponding to a third voltage range dV3. In operation S130, as a comparison result of the first distribution value and the second distribution value, when the first distribution value is found to be smaller than the second distribution value, the read voltage is determined as the $K^{th}$ test voltage VtsK.

According to the embodiment of the present invention, bits changed from a logical value "low" to a logical value "high" are checked whenever the page data is read while increasing the test voltage, and the read voltage is determined when the number of changed bits is smallest. That is, the semiconductor memory device 50 may regulate the read voltage itself.

Figure 6:
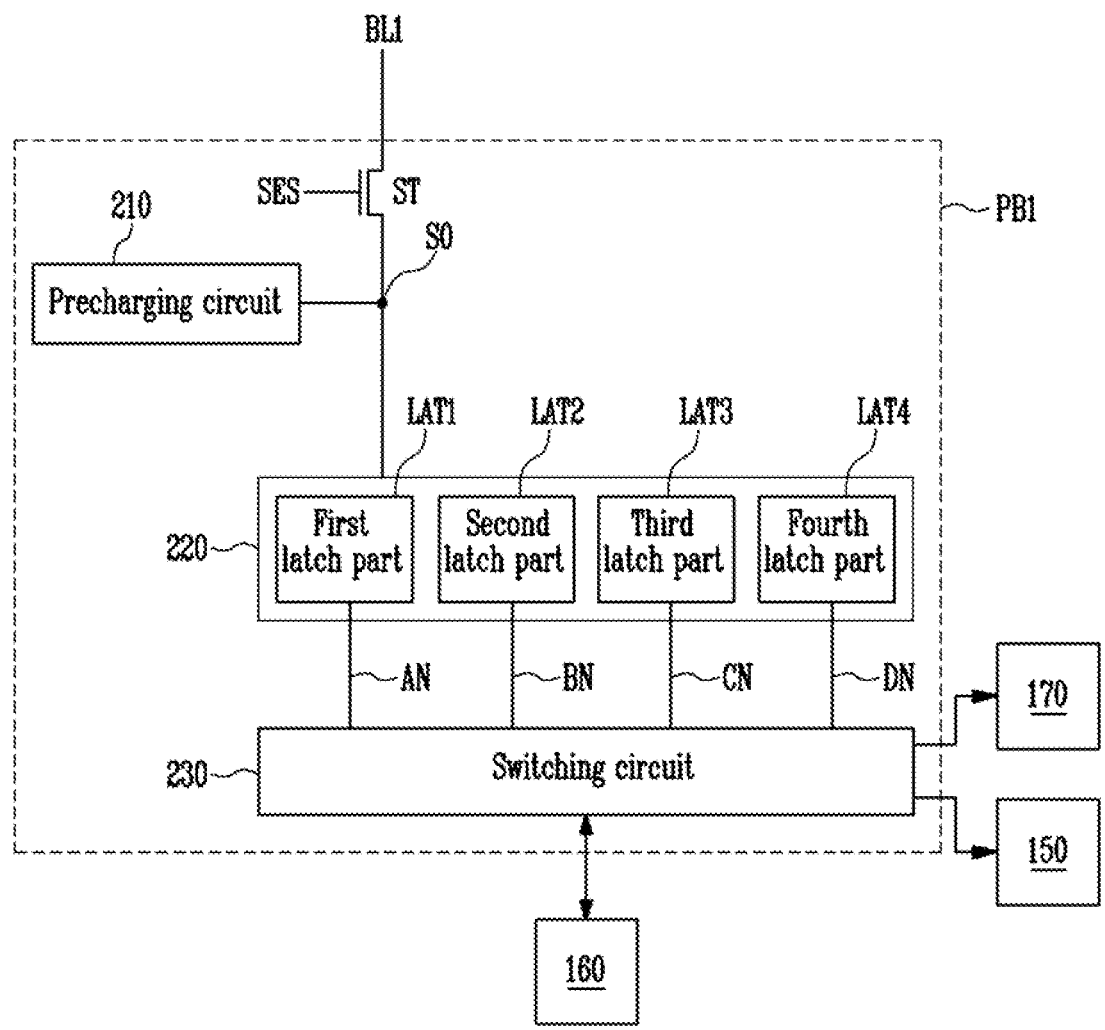
FIG. 6 is a block diagram showing one of page buffers of FIG. 2.

FIG. 6 is a block diagram showing one PB1 of page buffers PB1 to PBn of FIG. 2.

Referring to FIG. 6, a first page buffer P31 includes a sensing transistor ST, a precharging circuit 210, a latch circuit 220, and a switching circuit 230.

The sensing transistor ST is connected between a first bit line BL1 and a sense node SO. The sensing transistor ST is turned on in response to a sensing signal SES received from a control logic 160 (see FIG. 2).

The precharging circuit 210 is connected to the sense node SO, and to the first bit line BL1 through the sensing transistor ST. The precharging circuit 210 precharges the first bit line BL1 through the sensing transistor ST in response to control of the control logic 160.

The latch circuit 220 is connected to the sense node SO. The latch circuit 220 includes first to fourth latch parts LAT1 to LAT4. Each of the first to fourth latch parts LAT1 to LAT4 may store one bit. Data read from the memory cell through the first bit line BL1 is stored in the first latch part LAT1. The first to fourth latch parts LAT1 to LAT4 may exchange data in response to control of the control logic 160.

The first to fourth latch parts LAT1 to LAT4 are connected to the switching circuit 230 through first to fourth nodes AN to DN, respectively. The first to fourth latch parts LAT1 to LAT4 are connected to a data input/output circuit 150 and a comparator 170 through the switching circuit 230.

Figure 7:
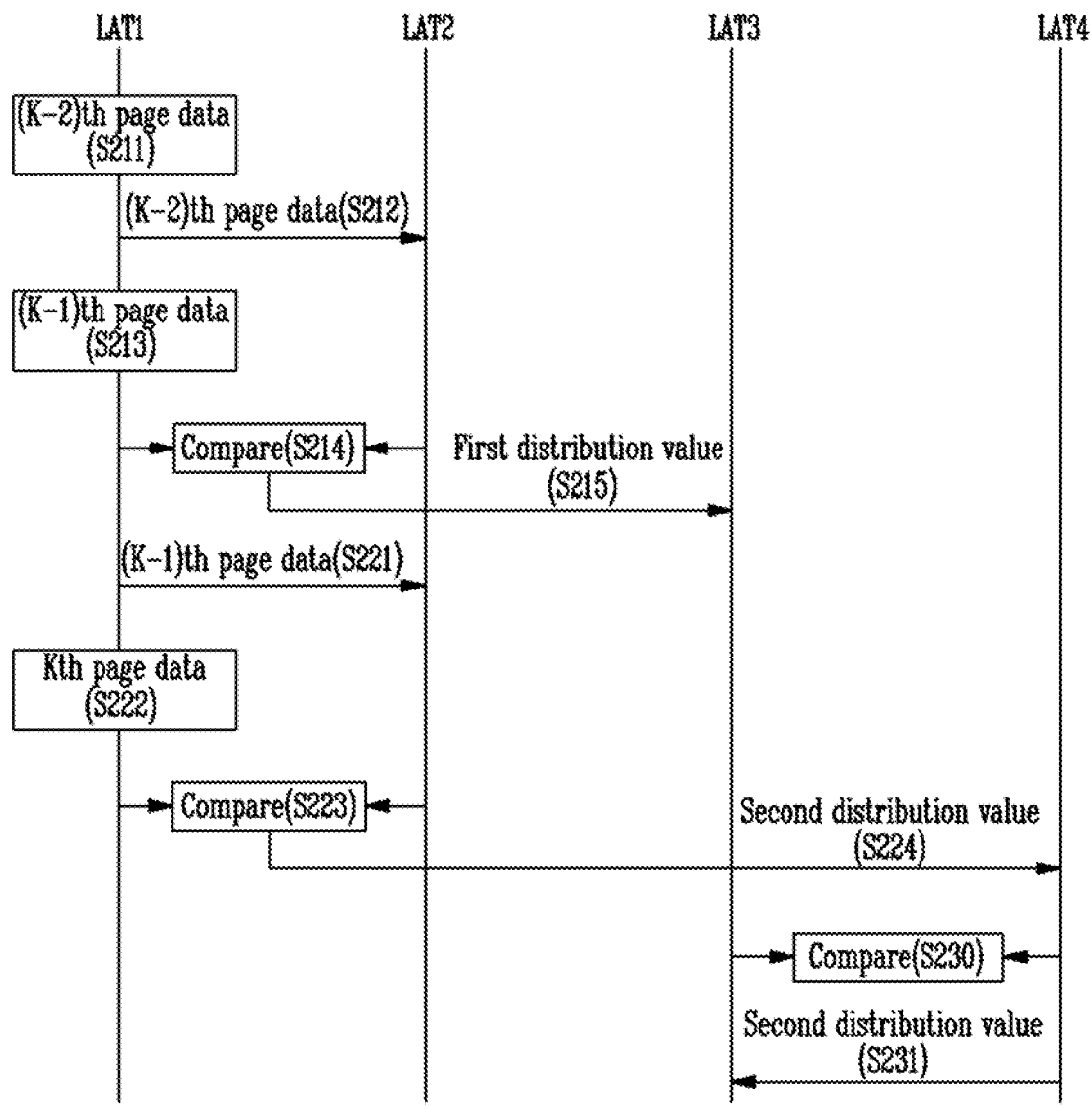
FIG. 7 is a view showing a method of operating semiconductor memory device according to an embodiment of the present invention in more detail.

FIG. 7 is a view showing a method of operating a semiconductor memory device 50 according to an embodiment of the present invention in more detail.

Referring to FIG. 7, in operation S211, first latches LATs1 (see LAT1 of FIG. 6) of page buffers PB1 to PBm store $(K-2)^{th}$ page data read from selected memory cells. In operation S212 the $(K-2)^{th}$ page data is transmitted to second latches LATs2 (see LAT2 of FIG. 6) of the page buffers PB1 to PBm.

In operation S213, $(K-1)^{th}$ page data is read from the selected memory cells, and stored in the first latches LATs1.

In operation S214, the $(K-1)^{th}$ page data stored in the first latches LATs1, and the $(K-2)^{th}$ page data stored in the second latches LATs2 are compared. In operation S215, a result of comparison is stored in third latches LATs3 (see LAT3 of FIG. 6) of the page buffers PB1 to PBm. The control logic 160 compares the $(K-1)^{th}$ page data and the $(K-2)^{th}$ page data, detects bits changed from a logical value "low" to a logical value "high" and stores the detected bits in the third latches LATs3. As an embodiment, the control logic 160 stores a logical value "high" in the latches corresponding to the detected bits of the third latches LATs3. Data stored in the third latches LATs3 corresponds to a first distribution value.

In operation S221, the $(K-1)^{th}$ page data is transmitted to and stored in the second latches LATs2.

In operation S222, the $K^{th}$ page data is read from the selected memory cells, and stored in the first latches LATs1.

In operation S223, the $K^{th}$ page data stored in the first latches LATs1 and the $(K-1)^{th}$ page data stored in the second latches LATs2 are, compared. In operation S224, a result of comparison is stored in fourth latches LATs4 (see LAT4 of FIG. 6) of the page buffers PB1 to PBm. The control logic 160 compares the $K^{th}$ page data and the $(K-1)^{th}$ page data, and detects bits changed from a logical value "low" to a logical value "high." As an embodiment, the control logic 160 may store a logical value "high" in each of the latches corresponding to the detected bits. Data stored in the fourth latches LATs4 corresponds to a second distribution value.

In operation S230, the data stored in the third latches LATs3 and the data stored in the fourth latches LATs4 are compared. As an example, the comparator 170 (see FIG. 2) determines which latches among the third latches LATs3 and the fourth latches LATs4 store more bits of a logical value "high." That is, the comparator 170 compares the first distribution value and the second distribution value. This will be described with reference to FIG. 10 in more detail.

In operation S231, the distribution value stored in the fourth latches LATs4 is stored in the third latches LATs3.

Thereafter, operations S221 to S224, and operations S230 and S231 are repeated according to a determination result of the comparator 170.

Figure 8:
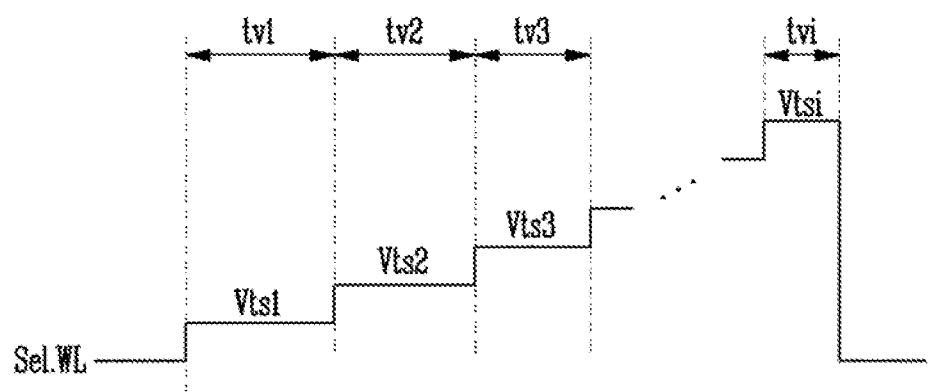
FIG. 8 is a diagram illustrating a read, method according to another embodiment.

FIG. 8 is a diagram illustrating a read method according to another embodiment.

FIG. 8 shows times tv1 to tvi during which the test voltages Vts are applied when the test voltages Vts gradually increasing during the read operation are continuously applied to the selected word line Sel. WL, where i is a positive integer.

For example, it is assumed that a first test voltage Vts1 is the lowest and an ith test voltage Vtsi is the highest, among the first to ith test voltages Vts1 to Vtsi. The higher test voltage is applied to the selected word line Sel. WL, the shorter time the test voltage is applied. More specifically, on the assumption that a time during which the first test voltage Vts1 is applied to the selected word line Sel. WL is a first time tv1, the second test voltage Vts2 higher than the first test voltage Vts1 may be applied to the selected word line Sel. WL during a second test tv2 shorter than the first time tv1. In this manner, the ith test voltage Vtsi may be applied to the selected word line Sel. WL during the shortest ith time tvi. This method may be used when a read operation is performed by changing only the test voltage Vts without precharging after the bit lines BL1 to BLn are precharged. By reducing the time during which the test voltage Vts is applied, the reduction of reliability caused by the reduction of the potentials of the bit lines BL1 to BLm that are precharged once, and the read operation time may be reduced.

Figure 9:
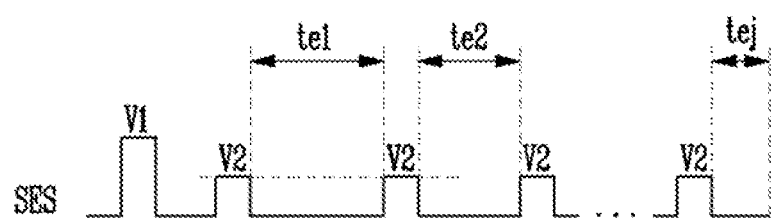
FIG. 9 is a diagram illustrating a read method according to another embodiment.

FIG. 9 is a diagram illustrating a read method according to another embodiment.

Referring to FIGS. 6 and 9, at the determining step performed during the above-described read operation, the potential of the bit line BL1 may be transferred to the page buffer in response to control of the sensing signal SES. When a predetermined amount of time passes after the test voltage is applied to the selected word line Sel. WL the potential of the bit line BL1 may be maintained at a precharge voltage or reduced, depending on a threshold voltage of a memory cell. For example, when the threshold voltage of the memory cell is greater than the test voltage, a channel may not be formed in the memory cell, so that the potential of the precharged bit line BL1 may be maintained at a precharge level. On the other hand, when the threshold voltage of the memory cell is lower than the test voltage, a channel may be formed in the memory cell, so that the common source line CSL, as shown in FIG. 3, which is connected to the ground terminal, and the precharged bit line BL1 may be connected to each other to lower the potential of the bit line BL1.

At the determining step, the potential of the bit line BL1 may be transferred to the latch of the page buffer PB1. When the sensing signal SES is applied to the sensing transistor ST to turn on the sensing transistor ST for the first time, the potential of the common source line CSL may be temporarily increased due to resistance of the common source line CSL.

To prevent the reduction of reliability caused by the temporary increase in the potential of the common source line CSL, the sensing signal SES having a first voltage V1 may be temporarily applied to the sensing transistor ST. However, data of the latch may not be sensed. Subsequently, for the actual sensing operation, the sensing signal SES having a second voltage V2 lower than the first voltage V may be applied to the sensing transistor T. Both first and second voltages V1 and V2 may be positive voltages. For example, when the sensing signal SES is deactivated the sensing signal SES may be at a low level, and when the sensing signal is activated, the sensing signal SES may be at a high level. In addition, the sensing signal SES may be at a high level when the sensing signal SES has the first or second voltage V1 or V2.

After the sensing signal SES having the second voltage V2 is applied, an evaluation period during the data stored in the latch is sensed may be performed for a predetermined time. According to an embodiment, since the plurality of test voltages Vts are used, the sensing signal SES having the second voltage V2 may be applied several times. Therefore, the evaluation period during which the sensing signal V2 having the second voltage V2 is deactivated may also be performed several times. During the evaluation period, the sensing signal SES may be at a low level. The time during which the evaluation period is performed may be gradually reduced. For example, on the assumption that the time during which the sensing signal SES having the second voltage V2 is used first is a first time te1, the sensing signal SES having the second voltage V2 may be applied to the sensing transistor ST again after the first time te1 passes. After the second sensing signal SES having the second voltage V2 is applied, the evaluation period may be performed during a second time te2 shorter than the first time te1. In this manner, evaluation periods may be performed during the first to jth times te1 to te2, where j is a positive integer. As described above, by reducing the time taken for the evaluation period, the reduction of reliability caused by the reduction of potentials of the bit lines BL1 to BLm that are precharged once may be prevented and the read operation time may be reduced. In addition, during the read operation of the semiconductor memory device, the embodiments described above with reference to FIGS. 8 and 9 may be applied separately or in combination with each other.

Figure 10:
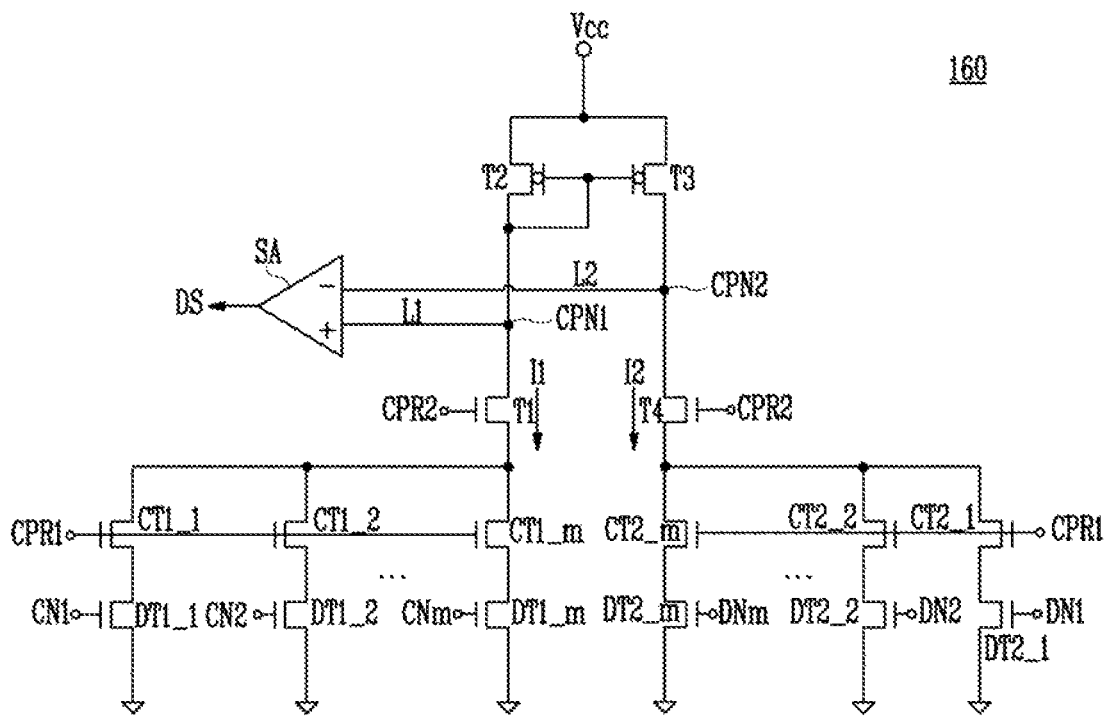
FIG. 10 is a circuit diagram showing a comparator.

FIG. 10 is a circuit diagram showing a comparator 170.

Referring to FIG. 10, the comparator 170 includes first detection transistors DT1_1 to DT1_m, first control transistors CT1_1 to CT1_m first to fourth transistors T1 to T4, second detection transistors DT2_1 to DT2_m, second control transistors CT2_1 to CT2_m, and a comparator SA.

The first detection transistors DT1_1 to DT1_M are connected between a reference node and the first control transistors CT1_1 to CT1_m. Gates of the first detection transistors DT1_1 to DT1_m are connected to third nodes CN1 to CNm (see CN of FIG. 6) in page buffers PB1 to PBm. That is, the first detection transistors DT1_1 to DT1_m are turned on in response to data stored in third latches LATs3.

The first control transistors CT1_1 to CT1_m are connected between the first detection transistors DT1_1 to DT1_m and the first transistor T1. The first control transistors CT1_1 to CT1_m operate in response to a first comparison signal CPR1. The first comparison signal CPR1 is provided from a control logic 160.

The first transistor T1 is connected between the first control transistors CT1_1 to CT1_m and a first comparison node CPN1, and operates in response to a second comparison signal CPR2. The second comparison signal CPR2 is provided from the control logic 160.

The second and third transistors T2 and T3 form a current mirror structure. The second transistor T2 is connected between a power voltage Vcc and the first comparison node CPN1. A drain and a gate of the second transistor T2 are connected with each other. The third transistor T3 is connected between the power voltage Vcc and a second comparison node CPN2. Gates of the second and third transistors T2 and T3 are connected with each other.

The fourth transistor T4 is connected between the second comparison node CPN2 and the second control transistors CT2_1 to CT2_m, and operates in response to the second comparison signal CPR2.

The second control transistors CT2_1 to CT2_m are connected between the fourth transistor T4 and the second detection transistors DT2_1 to DT2_m, and operate in response to the first comparison signal CPR1.

The second detection transistors DT2_1 to DT2_m are connected between the second control transistors CT2_1 to CT2_m and the reference node. Gates of the second detection transistors DT2_1 to DT2_m are connected to fourth nodes DN1 to DNm (see DN of FIG. 6) in the page buffers PB1 to PBm. That is, the second detection transistors DT2_1 to DT2_m are turned on in response to data stored in fourth latches LATs4.

The first detection transistors DT1_1 to DT1_m are turned on when the third latches LATs3 store a logical value "high." The number of turned-on first detection transistors DT1_1 to DT1_m is a first distribution value.

When the first and second comparison signals CPR1 and CPR2 are enabled, a first current I1 flows according to the number of turned-on first detection transistors DT1_1 to DT1_m. The first current I1 mirrors a second current I2.

The second detection transistors DT2_1 to DT2_m are turned on when the fourth latches LATs4 store a logical value "high." The number of turned-on second detection transistors DT2_1 to DT2_m is a second distribution value.

A voltage of the first comparison node CPN1 and a voltage of the second comparison node CPN2 are determined according to the first distribution value and the second distribution value, respectively. When the first distribution value is relatively great, resistances of the first detection transistors DT1_1 to DT1_m are small, and thus a voltage of the first comparison node CPN1 is also low. When the first distribution value is relatively small, resistances of the first detection transistors DT1_1 to DT1_m are increased, and thus the voltage of the first comparison node CPN1 is high.

Therefore, when the first distribution value is greater than the second distribution value, the voltage of the first comparison node CPN1 is lower than that of the second comparison node CPN2. Thus, the comparator SA disables a detection signal DS. When the first distribution value is smaller than the second distribution value, the voltage of the first comparison node CPN1 is higher than that of the second comparison node CPN2. Thus, the comparator SA enables the detection signal DS.

The control logic 160 determines a corresponding test voltage as a read voltage when the detection signal DS is enabled, and controls the voltage generator 130 to generate the determined read voltage.

Figure 11:
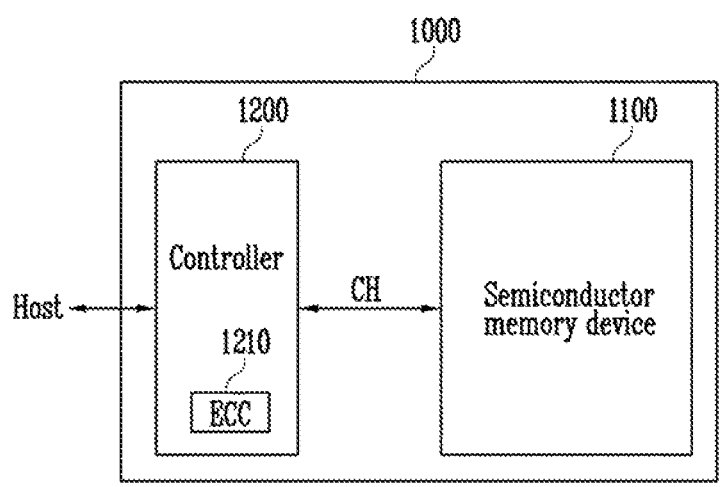
FIG. 11 is a block diagram showing a memory system including a semiconductor memory device.

FIG. 11 is a block diagram showing a memory system 1000 including a semiconductor memory device 1100.

Referring to FIG. 11, the memory system 1000 includes the semiconductor memory device 1100 and a controller 1200.

The semiconductor memory device 1100 is configured and operates as the semiconductor memory device 50 described with reference to FIG. 2. Repeated descriptions will be omitted below.

The controller 1200 is connected between a host Host and the semiconductor memory device 1100. The controller 1200 is configured to control the semiconductor memory device 1100. The controller 1200 is configured to access the semiconductor memory device 1100 in response to a request from the host Host. For example, the controller 1200 is configured to control read, write, erase, and background operations of the semiconductor memory device 1100. The controller 1200 is configured to provide an interface between the semiconductor memory device 1100 and the host Host. The controller 1200 is configured to drive firmware in order to control the semiconductor memory device 1100.

The controller 1200 includes an error correcting code (ECC) circuit 1210. The ECC circuit 1210 generates a parity bit using data to be stored in the semiconductor memory device 1100. The generated parity bit is stored in a spare area of the semiconductor memory device 1100. The ECC circuit 1210 detects and corrects an error of data read from the semiconductor memory device 1100 using the parity bit. However, when more error bits than a predetermined number are included in the read data, the corresponding error bits cannot be corrected. Here, the controller 1200 controls the semiconductor memory device 1100 to reset a read voltage.

Figure 12:
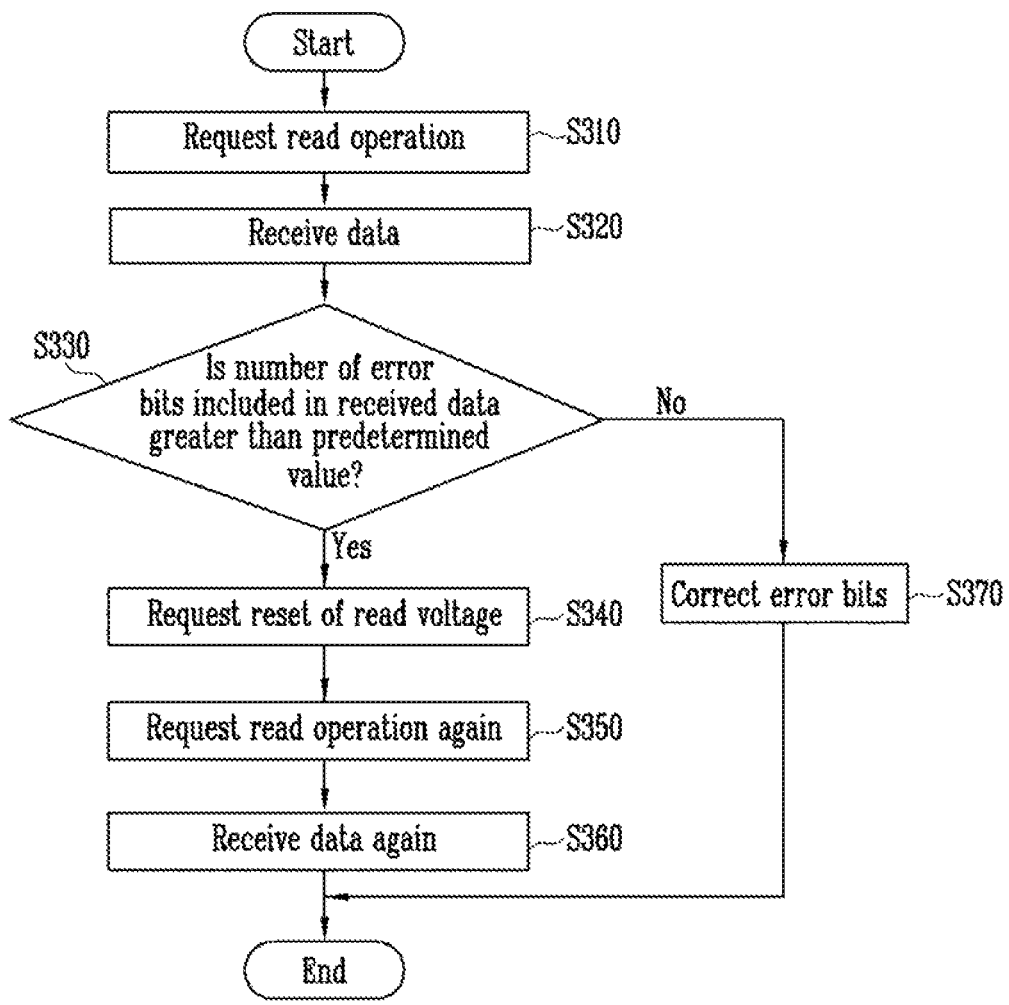
FIG. 12 is a flowchart showing a method of operating a controller of FIG. 9.

FIG. 12 is flowchart showing method of operating a controller 200 of FIG. 9.

Referring to FIG. 12, in operation S310, the controller 1200 requests a read operation to a semiconductor memory device 1100. The controller 1200 transmits a command CMD (see FIG. 2) and an address ADR corresponding to the read operation to the semiconductor memory device 1100.

In operation S320, the controller 1200 receives data through the read operation.

In operation S330, the ECC circuit 1210 determines whether the number of error bits included in the received data is greater than a predetermined value. Here, the predetermined value means the number of error bits correctable by the ECC circuit 1210.

In operation S340 the controller 1200 transmits a command CMD that requests to reset a read voltage to the semiconductor memory device 1100. The semiconductor memory device 1100 resets the read voltage in response to the command CMD as described with reference to FIG. 8.

In operation S350, when resetting of the read voltage is finished, the controller 1200 requests the read operation from the semiconductor memory device 1100 again. In operation S360, the controller 1200 receives the data again.

When the number of error bits included in the received data is smaller than the predetermined value, the ECC circuit 1210 corrects the error bits (S370).

Figure 13:
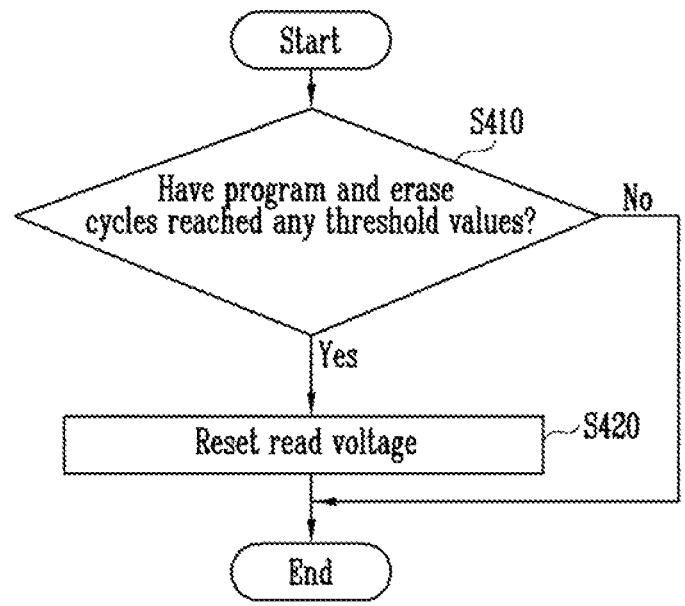
FIG. 13 is a flowchart showing a method of operating a semiconductor memory device.

FIG. 13 is a flowchart showing a method of operating semiconductor memory device 1100.

Referring to FIG. 13, in operation S410, it is determined whether program and erase cycles of the semiconductor memory device 1100 have reached any threshold values. As an embodiment, a control logic 160 (see FIG. 2) may manage the program and erase cycles, and store information of the program and erase cycles in one memory block of the memory blocks BLK1 to BLKz (see FIG. 2).

In operation S420, when the program and erase cycles have reached one of the threshold values, a read voltage is reset as described with reference to FIGS. 2 to 8.

In addition to the embodiments referring to FIGS. 10 and 11, the read voltage of the semiconductor memory device 1100 may be, regulated under various conditions. For example, the semiconductor memory device 1100 may reset the read voltage each predetermined time period.

Figure 14:
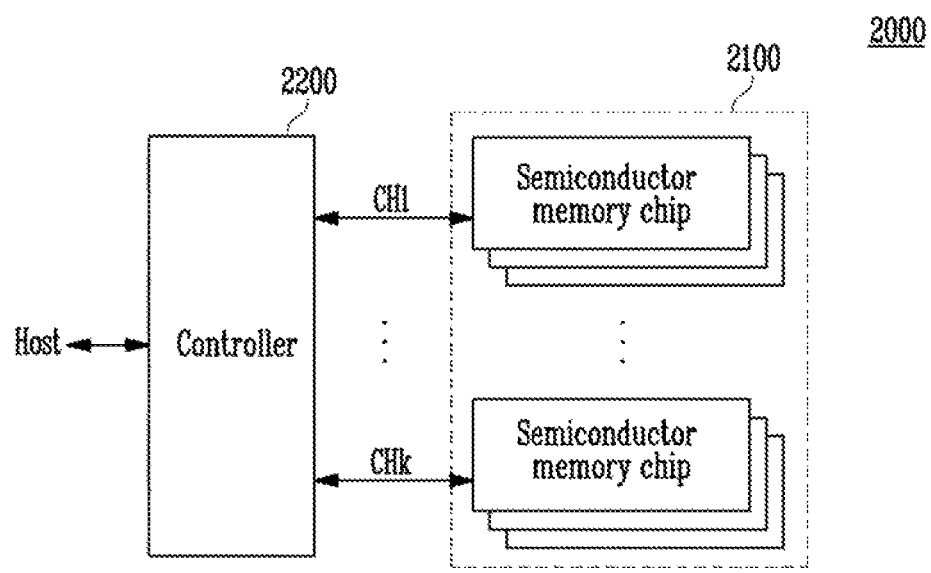
FIG. 14 is a block diagram showing a memory system according to another embodiment.

FIG. 14 is a block diagram showing a memory system 2000 according to another embodiment.

Referring to FIG. 14, the memory system 2000 includes a semiconductor memory device 2100 and a controller 2200. The semiconductor memory device 2100 includes a plurality of semiconductor memory chips. The plurality of semiconductor memory chips are divided into a plurality of groups. Each group is configured to communicate with the controller 2200 through one common channel. In FIG. 12, the plurality of groups are shown to communicate with the controller 2200 through each of first to k$^{th}$ channels CH1 to CHk. Each semiconductor memory chip operates the same as the semiconductor memory device 50 described with reference to FIG. 2.

In FIG. 12, it is described that the plurality of semiconductor memory chips are connected to one channel. However, it will be understood that the memory system 2000 can be changed so that one semiconductor memory chip is connected to one channel.

The semiconductor memory device 2100 and the controller 2200 may be integrated into one semiconductor device. As an embodiment, the semiconductor memory device 2100 and the controller 2200 may be integrated into one semiconductor device and configure a memory card. For example, the semiconductor memory device 2100 and the controller 2200 are integrated into one semiconductor device and may configure a memory card such as a personal computer (PC) card (Personal Computer Memory Card International Association (PCMCIA)), a Compact Flash (CF) card, a SmartMedia (SM) card (SMC), a Memory Stick, an MMC (reduced Size MMC (RS-MMC), MMCmicro), a Secure Digital (SD) card (miniSD, microSD, SD High Capacity (SDHC)), a Universal Flash Storage (UFS), and so on.

The semiconductor memory device 2100 and the controller 2200 are integrated into one semiconductor device and may configure a solid state drive (SSD). The SSD includes a storage device configured to store data in a semiconductor memory. When the memory system 2000 is used as the SSD, an operation speed of the host Host connected to the memory system 2000 is innovatively enhanced.

As another example, the memory system 2000 is provided as at least one of various components of an electronic device such as a computer, an ultra mobile PC (UMPC), a workstation, a netbook, a personal digital assistant (PDA), a portable computer, a web tablet, a wireless phone, a mobile phone, a smartphone, an e-book a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring computer network at least one of various electronic devices configuring a telematics network, an RFID device, at least one of various components configuring a computing system, etc.

As an embodiment, the semiconductor memory device 2100 or the memory system 2000 may be mounted using various forms of packages. For example, the semiconductor memory device 2100 or the memory system 2000 may be packaged in such a manner such as a package on package (PoP), ball grid arrays (BGAs), chip scale packages (CSPs), a plastic leaded chip carrier (PLCC), a plastic dual inline package (PDIP), a die in waffle pack, a die in wafer form, a chip on board (COB), a ceramic dual inline package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), and so on, and may be mounted.

Figure 15:
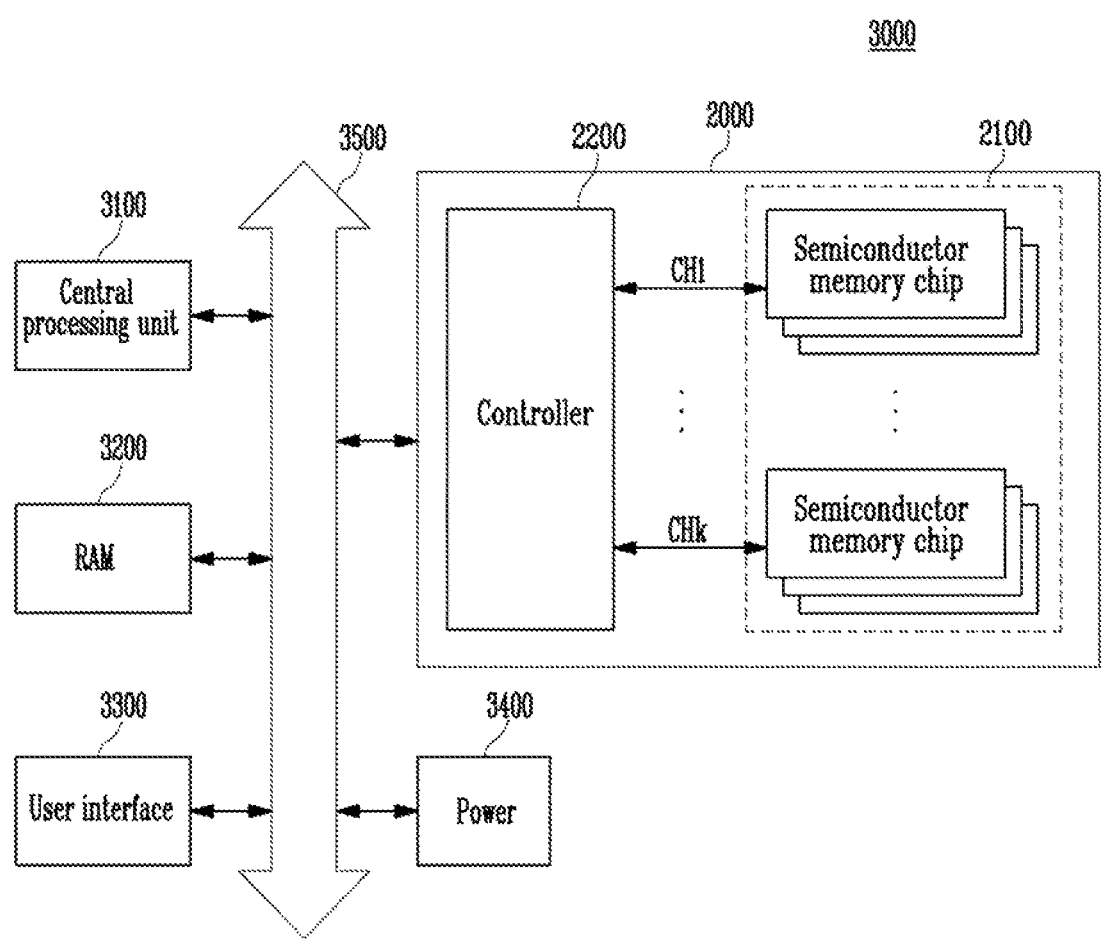
FIG. 15 is a block diagram showing a computing system including a memory system described with reference to FIG. 14.

FIG. 15 is a block diagram showing a computing system 3000 including a memory system 2000 described with reference to FIG. 12.

Referring to FIG. 15, the computing system 3000 includes a central processing unit 3100, a random access memory (RAM) 3200, a user interface 3300, a power 3400, a system bus 3500, and the memory system 2000.

The memory system 2000 is electrically connected to the central processing unit 3100, the RAM 3200, the user interface 3300, and the power 3400 through the system bus 3500. Data which is provided through the user interface 3300 or processed by the central processing unit 3100, is stored in the memory system 2000.

In FIG. 15, a semiconductor memory device 2100 is shown to be connected to the system bus 3500 through the controller 2200. However, the semiconductor memory device 2100 may be configured to be directly connected to the system bus 3500. Here, a function of the controller 2200 may be performed by the central processing unit 3100 and the RAM 3200

According to the present invention, a read operation speed and a regulating speed of a read voltage of the semiconductor memory device are improved.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device, comprising;
memory cells coupled to a word line; and
a peripheral circuit configured to read first to kth page data from the memory cells by sequentially applying first to kth test voltages, to the word line, where k is a natural number greater than 3,
wherein the first to kth test voltages are sequentially increased, and respective application times of the first to kth test voltages applied to the word line are sequentially reduced.

2. The semiconductor device of claim 1, wherein the peripheral circuit configured to:
apply the first test voltage to the word line during a first time,
apply a second test voltage to the word line during a second time shorter than the first time, and
apply the kth test voltage to the word line during a shortest kth time.

3. The semiconductor memory device of claim 1, wherein the peripheral circuit is configured to precharge bit lines coupled to the memory cells once before applying the first to lath test voltages to the word line.

4. The semiconductor memory device of claim 1, wherein the peripheral circuit includes page buffers including a plurality of latches storing data in response to potentials of the bit lines coupled to the memory cells.

5. The semiconductor memory device of claim 4, wherein the page buffers include sensing transistors connecting or blocking the bit lines and the latches to or from each other in response to a sensing signal.

6. The semiconductor memory device of claim 5, wherein the sensing signal is deactivated to a low level or activated to a high level.

7. The semiconductor memory device of claim 6, wherein the sensing signal has a positive voltage corresponding to a first voltage or a second voltage when the sensing signal is activated.

8. The semiconductor memory device of claim 7, wherein potentials of the bit lines are transferred to the latches when the sensing signal is activated to have the second voltage.

9. The semiconductor memory device of claim 8, wherein the sensing signal includes a plurality of activation periods having the second voltage, and
a plurality of deactivation periods are included between the activation periods.

10. The semiconductor memory device of claim 9, wherein the peripheral circuit is configured to gradually reduce times of the plurality of deactivation periods.

11. The semiconductor memory device of claim 1, wherein the peripheral circuit is configured to determine a read voltage applied to the word line during a read operation by comparing a number of data hits changed between (k-2)th page data and (k-1)th page data with a number of data bits changed between the (k-1)th page data and the kth page data.

* * * * *